(12) United States Patent
Mann et al.

(10) Patent No.: US 11,496,148 B2
(45) Date of Patent: Nov. 8, 2022

(54) ANALOG TO DIGITAL CONVERTER WITH FLOATING DIGITAL CHANNEL CONFIGURATION

(71) Applicant: Cypress Semiconductor Corporation, San Jose, CA (US)

(72) Inventors: Eric N. Mann, Issaquah, WA (US); Erhan Hancioglu, Bothell, WA (US); Eashwar Thiagarajan, Bothell, WA (US); Harold Kutz, Edmonds, WA (US); Amsby D Richardson, Jr., Lynnwood, WA (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 17/242,728

(22) Filed: Apr. 28, 2021

(65) Prior Publication Data

US 2022/0302925 A1    Sep. 22, 2022

Related U.S. Application Data

(60) Provisional application No. 63/162,357, filed on Mar. 17, 2021.

(51) Int. Cl.
*H03M 3/00* (2006.01)
*H03M 1/06* (2006.01)
*H03M 1/18* (2006.01)

(52) U.S. Cl.
CPC ......... *H03M 3/462* (2013.01); *H03M 1/0602* (2013.01); *H03M 1/18* (2013.01); *H03M 3/352* (2013.01)

(58) Field of Classification Search
CPC .... H03M 3/352; H03M 3/462; H03M 1/0602; H03M 1/18
USPC .................................................. 341/126–155
See application file for complete search history.

(56) References Cited

U.S. PATENT DOCUMENTS

| | | | |
|---|---|---|---|
| 7,142,606 B2 * | 11/2006 | Talwalkar | H03M 3/474 375/259 |
| 10,355,709 B1 * | 7/2019 | Sharma | H03M 3/474 |
| 2004/0066803 A1 * | 4/2004 | Talwalkar | H03M 3/474 370/535 |
| 2007/0176814 A1 * | 8/2007 | Grace | H03M 1/1042 341/155 |
| 2007/0176841 A1 * | 8/2007 | Kamada | H01Q 1/40 343/700 MS |

\* cited by examiner

*Primary Examiner* — Lam T Mai

(57) ABSTRACT

One or more systems and/or methods for implementing an analog-to-digital converter system with a floating digital channel configuration are provided. An analog input component is configured to receive measured analog signals, and output analog signals, corresponding to the measured analog signals, to an analog channel coupled to the analog input component. The analog channel is coupled to a switching component connected to a first digital channel and a second digital channel. The analog channel comprises a modulator configured to convert the analog signals into a data stream selectively input by the switching component to the first digital channel or the second digital channel.

20 Claims, 16 Drawing Sheets

ANALOG TO DIGITAL CONVERTER WITH FLOATING DIGITAL CHANNEL CONFIGURATION

RELATED APPLICATIONS

This application claims priority to U.S. Provisional Patent Application, titled "ANALOG TO DIGITAL CONVERTER WITH FLOATING DIGITAL CHANNEL CONFIGURATION", filed on Mar. 17, 2021 and accorded U.S. Application No. 63/162,357, which is incorporated herein by reference.

TECHNICAL FIELD

The present disclosure relates generally to analog-to-digital converters, and more particularly to an analog-to-digital converter having a floating digital channel configuration.

BACKGROUND

An analog-to-digital converter can convert an analog input signal into a digital signal. Analog-to-digital converters have many applications, uses, etc., such as in electronic devices. For example, an analog-to-digital converter can convert analog measurements of sounds picked up by a microphone and/or light entering a digital camera into one or more digital signals. As another example, an analog-to-digital converter may convert analog measurements of voltages and/or currents into one or more digital signals, such as representative of magnitudes of the voltages and/or currents.

SUMMARY

This Summary is provided to introduce a selection of concepts in a simplified form that are further described below in the Detailed Description. This Summary is not intended to identify key factors or essential features of the claimed subject matter, nor is it intended to be used to limit the scope of the claimed subject matter.

In an embodiment of the techniques presented herein, a system is provided. The system includes an analog input component configured to receive measured analog signals and output analog signals, corresponding to the measured analog signals, to a first analog channel coupled to the analog input component. The first analog channel is coupled to a switching component connected to a first digital channel and a second digital channel. The first analog channel comprises a modulator configured to convert the analog signals into a data stream selectively input by the switching component to the first digital channel or the second digital channel.

In an embodiment of the techniques presented herein, a method is provided. The method includes initializing a first decimator, of a first digital channel coupled to a switching component connected to an analog channel, to process a data stream input from a modulator of the analog channel through the switching component to the first digital channel. A second decimator, of a second digital channel coupled to the switching component connected to the analog channel, is initialized to process the data stream input from the modulator of the analog channel through the switching component to the second digital channel. A switching state of the switching component is modified to switch the data stream from being input into the first digital channel to being input into the second digital channel after the switching state of the switching component inputs the data stream into the first digital channel.

In an embodiment of the techniques presented herein, an apparatus is provided. The apparatus includes a means for initializing a first decimator, of a first digital channel coupled to a switching component connected to an analog channel, to process a data stream input from a modulator of the analog channel through the switching component to the first digital channel. The apparatus comprises a means for initializing a second decimator, of a second digital channel coupled to the switching component connected to the analog channel, to process the data stream input from the modulator of the analog channel through the switching component to the second digital channel. The apparatus comprises a means for modifying a switching state of the switching component to switch the data stream from being input into the first digital channel to being input into the second digital channel after the switching state of the switching component inputs the data stream into the first digital channel.

In an embodiment of the techniques presented herein, a method is provided. The method includes applying a first set of parameters to a component of a digital channel to initialize the component to perform a first type of processing upon a data stream input into the digital channel by a modulator of an analog channel. In response to determining that the component is to perform a second type of processing upon the data stream, a second set of parameters, comprising at least one parameter different than parameters of the first set of parameters, is applied to the component to initialize the component to perform the second type of processing upon the data stream.

In an embodiment of the techniques presented herein, an apparatus is provided. The apparatus includes a means for applying a first set of parameters to a component of a digital channel to initialize the component to perform a first type of processing upon a data stream input into the digital channel by a modulator of an analog channel. The apparatus comprises a means for in response to determining that the component is to perform a second type of processing upon the data stream, applying a second set of parameters, comprising at least one parameter different than parameters of the first set of parameters, to the component to initialize the component to perform the second type of processing upon the data stream To the accomplishment of the foregoing and related ends, the following description and annexed drawings set forth certain illustrative aspects and implementations. These are indicative of but a few of the various ways in which one or more aspects may be employed. Other aspects, advantages, and novel features of the disclosure will become apparent from the following detailed description when considered in conjunction with the annexed drawings.

DESCRIPTION OF THE DRAWINGS

FIG. 10 is an illustration of an example timing diagram, according to some embodiments.

DETAILED DESCRIPTION

Figure 1A:
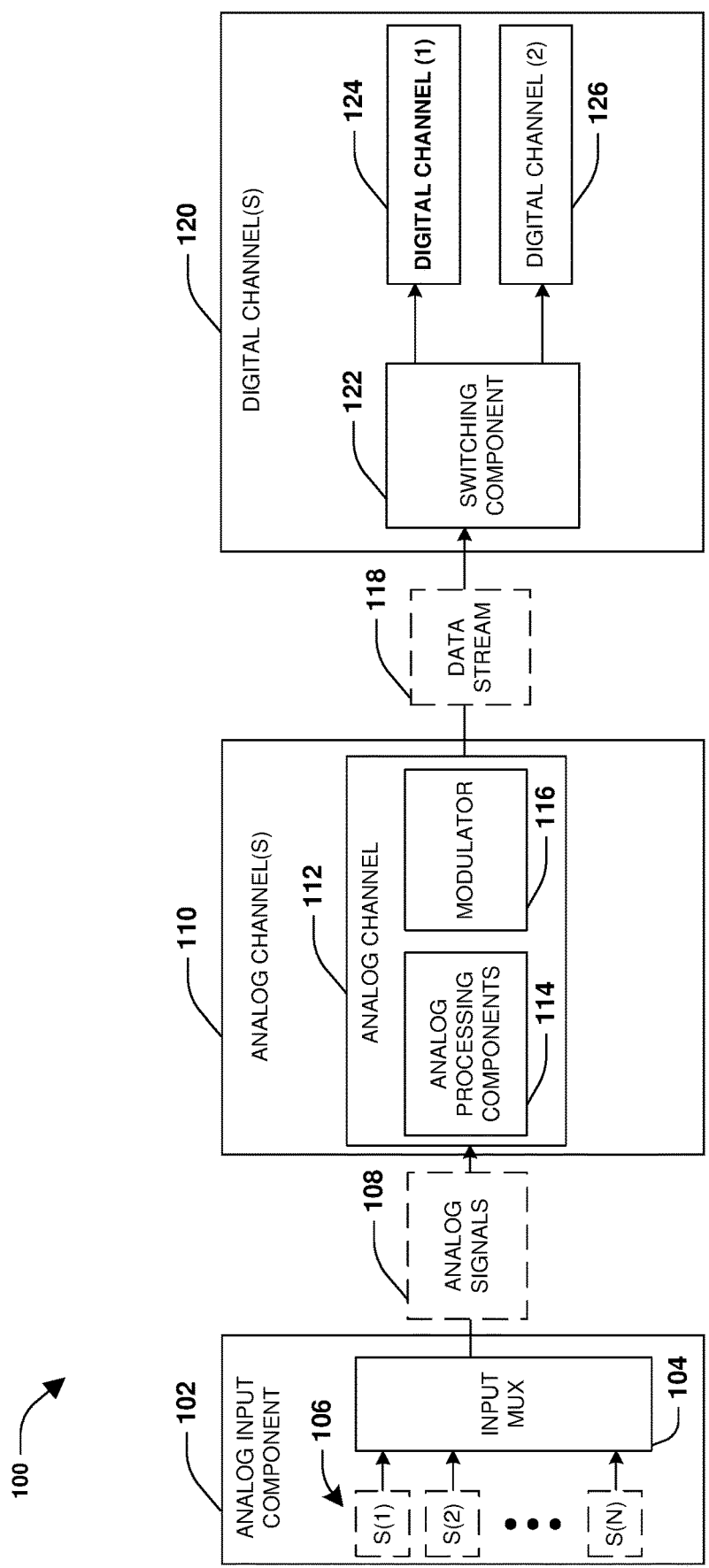
FIG. 1A is a component block diagram illustrating an example analog-to-digital converter system with a floating digital channel configuration, where a data stream is routed to a first digital channel, according to some embodiments.

The claimed subject matter is now described with reference to the drawings, wherein like reference numerals are used to refer to like elements throughout. In the following description, for purposes of explanation, numerous specific details are set forth in order to provide a thorough understanding of the claimed subject matter. It may be evident, however, that the claimed subject matter may be practiced without these specific details. In other instances, well-known structures and device structures are shown in block diagram form in order to facilitate describing the claimed subject matter.

A delta-sigma analog-to-digital converter system includes an analog channel terminating with a delta-sigma modulator. The delta-sigma modulator may be configured to output a relatively low resolution high sample rate data stream. The delta-sigma modulator is followed by a digital channel. The digital channel may comprise a decimator. The decimator may be configured to convert the relatively low resolution high sample rate data stream from the delta-sigma modulator into a relatively higher resolution lower sample rate output for the delta-sigma analog-to-digital converter system.

When the delta-sigma analog-to-digital converter system is measuring more than one analog input, the delta-sigma analog-to-digital converter system has to be reset and/or wait for a digital filter to stabilize with delta-sigma modulator measurements. If digital calibration is used, then calibration coefficients need to be updated before measurements can begin. This can introduce significant delay to the operation of the delta-sigma analog-to-digital converter system when more than one analog input is processed by the single digital channel of the delta-sigma analog-to-digital converter system. Such delay and/or other issues are addressed, mitigated, etc. as provided herein.

According to some embodiments, a floating digital channel configuration is provided for an analog-to-digital converter system, such as a delta-sigma analog-to-digital converter system. With this floating digital channel configuration, an analog channel of the analog-to-digital converter system can be shared across multiple digital channels or multiple virtual digital channels. In some embodiments, the analog channel is shared by multiple physical digital channels that are connected to the analog channel through a switching component.

In some embodiments, the analog channel is shared amongst multiple virtual digital channels. The multiple virtual digital channels may share the same or similar digital channel components, such as a decimator, a compensation component, a filter component, a threshold comparison component, etc. The multiple virtual digital channels are implemented by applying different sets of parameters to the digital channel components to change the operation of one or more of the digital channel components. Each set of parameters may correspond to operation of a particular virtual digital channel. In some embodiments, one or more parameters (parameter values) of a first set of parameters of a first virtual digital channel may differ from one or more parameters (parameter values) of a second set of parameters of a second virtual digital channel. In some embodiments, at least one parameter (parameter value) may differ between two sets of parameters, while other parameters may be the same or similar amongst the two sets of parameters. It may be appreciated that the floating digital channel configuration of the analog-to-digital converter system may provide for the sharing of any number of digital channels (e.g., physical digital channels, virtual digital channels, etc.) amongst any number of analog channels.

Conventional analog-to-digital converter systems comprise an analog channel connected to a single digital channel. In an example, an analog-to-digital convert system may be part of an automotive intelligent battery sensor that may measure temperature, voltage, current, diagnostic information, and/or other data associated with a battery of a vehicle. If one of these analog-to-digital converter systems is configured to measure more than one analog input, then the analog-to-digital converter system has to be reset and/or wait for a digital filter to stabilize with delta-sigma modulator measurements associated with a delta-sigma modulator of the analog channel. If digital calibration is used, then calibration coefficients need to be updated before measurements can begin. This introduces significant delay to the operation of the analog-to-digital converter system when more than one analog input is processed by the single digital channel of the analog-to-digital converter system. Alternatively, separate analog channel to digital channel pairings may be implemented for each analog input (e.g., a first analog channel and a first digital channel for temperature, a second analog channel and a second digital channel for voltage, etc.). This will consume a large amount of power and area because each analog channel consumes a substantial amount of power (e.g., 1 mA to 2 mA per analog channel) and physical area.

Accordingly, as provided herein, the floating digital channel configuration allows for an analog channel of an analog-to-digital converter system to share multiple digital channels. The amount of time to switch from processing one analog input to processing another analog input is greatly reduced when the analog channel can share multiple digital channels because different digital channels can be tailored to process each type of analog input. This reduces the operational delay of the analog-to-digital converter system when switching between measuring different analog inputs. Otherwise, if there was merely a single digital channel, then additional operational delay would be introduced due to the time it takes to reset the digital channel, wait for a digital filter to stabilize with delta-sigma modulator measurements, and/or wait for calibration coefficients to be updated. Furthermore, instead of having separate analog channel to digital channel pairings for each analog input, a reduced number of analog channels such as a single analog channel can be paired with multiple digital channels for each analog input. Reducing the number of analog channels will reduce the power consumption and area consumed by the analog-to-digital converter system. This is because analog channels consume a significant amount of power and area compared to digital channels. Thus the floating digital channel configuration allows for a single analog channel to be shared with multiple digital channels that consume less power and area than if more analog channels were implemented. In this way, the floating digital channel configuration reduces the power consumption, area, operational delay, and cost associated with analog-to-digital converter systems that can be utilized for various use cases, such as in an architecture for automotive intelligent battery sensors or any other use cases where analog signals are converted to digital signals.

FIGS. 1A-1D illustrate an analog-to-digital converter system 100 having a floating digital channel configuration. The analog-to-digital converter system 100 comprises an analog input component 102. The analog input component 102 may be configured to receive measured analog signals 106 from one or more source channels. In some embodiments, the measured analog signals 106 may correspond to voltage measurements received by the analog input component 102 over a first source channel, temperature measurements received by the analog input component 102 over a second source channel, and/or any other type of analog signals received over any number of source channels. The analog input component 102 is configured to output analog signals 108, corresponding to the measured analog signals 106, to one or more analog channels 110 of the analog-to-digital converter system 100 using an input multiplexor 104 to selectively output a measured analog signal of a particular source channel as the output analog signals 108. In some embodiments, the analog-to-digital converter system 100 comprises an analog channel 112, as illustrated by FIGS. 1A-1D.

The analog channel 112 may comprise analog processing components 114 and a modulator 116 such as a delta-sigma modulator that transform the analog signals 108 into a data stream 118. In some embodiments, the analog processing components 114 comprise a programmable-gain amplifier that can amplify the analog signals 108. In some embodiments, the analog processing components 114 comprise an anti-aliasing filter. In some embodiments, the analog processing components 114 comprise a multiplexer. In some embodiments, the analog processing components 114 comprise a buffer. In this way, the analog processing components 114 may comprise various components for processing the analog signals 108 to create the data stream 118. After the analog processing components 114 have processed the analog signals 108, the modulator 116 such as the delta-sigma modulator may transform the analog signals 108 into the data stream 118. The data stream 118 may have a first resolution (e.g., a relatively lower resolution) and a first sample rate (e.g., a relatively higher sample rate).

The data stream 118 is output from the modulator 116 to a switching component 122 associated with one or more digital channels 120 of the analog-to-digital converter system 100. In some embodiments, the switching component 122 may be coupled to a first digital channel 124 and a second digital channel 126. The first digital channel 124 may comprise one or more components configured to perform functions that process the data stream 118 based upon a first set of parameters. The second digital channel 126 may comprise one or more components configured to perform functions that process the data stream 118 based upon a second set of a parameters. In some embodiments, the first set of a parameters comprises at least one parameter (parameter value) that is different than a parameter (parameter value) of the second set of parameters. In this way, the first digital channel 124 may process the data stream 118 differently than the second digital channel 126. For example, the first digital channel 124 is configured to process a first type of data (e.g., voltage measurements within the data stream 118) based upon the first set of parameters and the second digital channel 126 is configured to process a second type of data (e.g., temperature measurements within the data stream 118), according to some embodiments.

Figure 7:
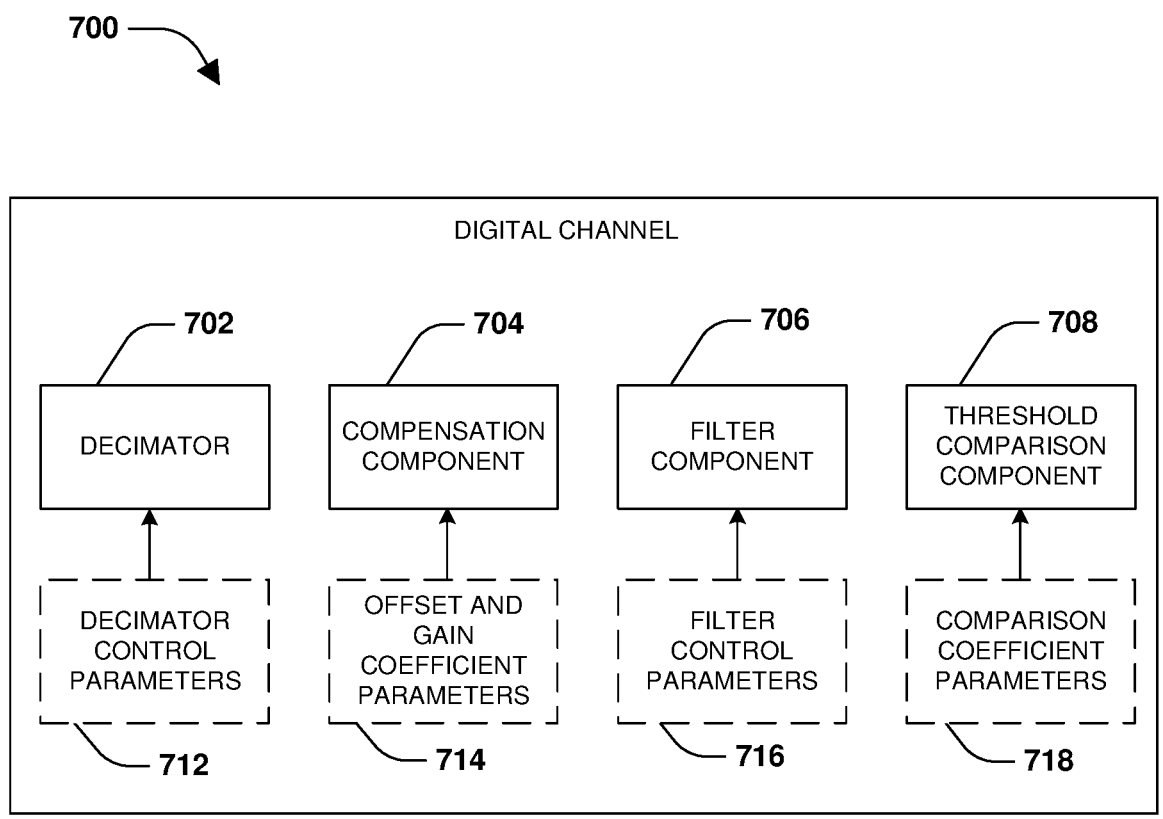
FIG. 7 is a component block diagram illustrating an example digital channel, according to some embodiments.

An example of the first digital channel 124 or the second digital channel 126 is illustrated as digital channel 700 of FIG. 7. The digital channel 700 may comprise one or more components, such as a decimator 702, a compensation component 704, a filter component 706, a threshold comparison component 708, and/or other components. The decimator 702 may utilize decimation control parameters 712 for processing the data stream 118, such as to convert the data stream from the first resolution and first sample rate to a different resolution and/or different sample rate. For example, the data stream may be converted from a relatively lower resolution and higher sample rate to a relatively higher resolution and lower sample rate. The compensation component 704 may utilize offset and gain coefficient parameters 714 to process the data stream 118, such as to process the output from the decimator 702. The filter component 706 may utilize filter control parameters 716 to process the data stream 118, such as to process the output from the decimator 702 or the compensation component 704. The threshold comparison component 708 may utilize comparison coefficient parameters 718 to process the data stream 118, such as to process the output from the decimator 702, the compensation component 704, or the filter component 706. In this way, the digital channel 700, such as the first digital channel 124 or the second digital channel 126, may process the data stream 118 to output a digital signal.

Returning to FIG. 1A, the switching component 122, such as a multiplexor or other switching component, may be controlled to selectively input the data stream 118 to the first digital channel 124 or the second digital channel 126. As illustrated by FIG. 1A, the switching component 122 inputs the data stream 118 to the first digital channel 124. A decimator of the first digital channel 124 may utilize a first set of decimator control parameters to convert the data stream 118 having the first resolution and the first sample rate to a first output data stream having a second resolution and second sample rate different than the first resolution and the first sample rate. In some embodiments, one or more other components of the first digital channel 124 may process the first output data stream to create a digital output for the first digital channel 124.

Figure 1B:
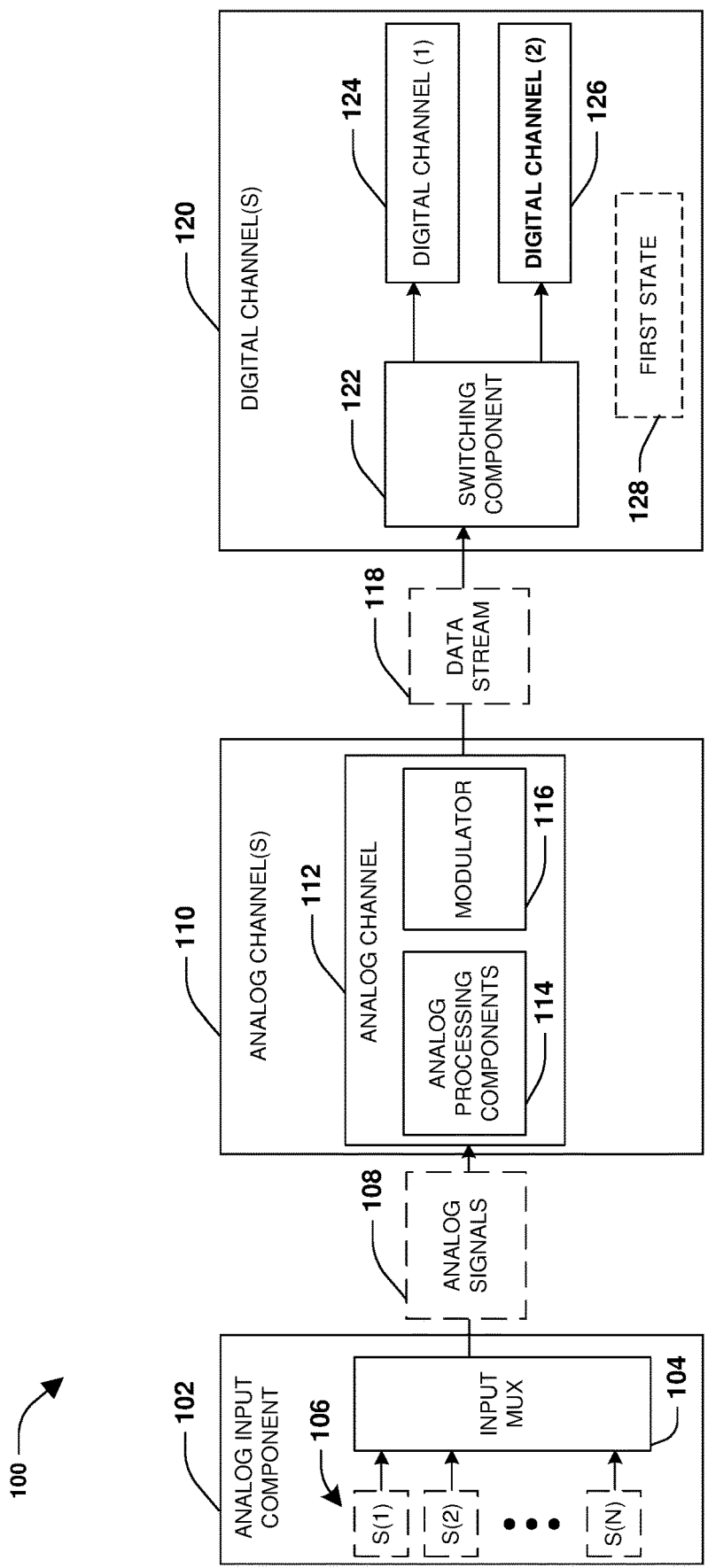
FIG. 1B is a component block diagram illustrating an example analog-to-digital converter system with a floating digital channel configuration, where a data stream is routed to a second digital channel, according to some embodiments.
Figure 1C:
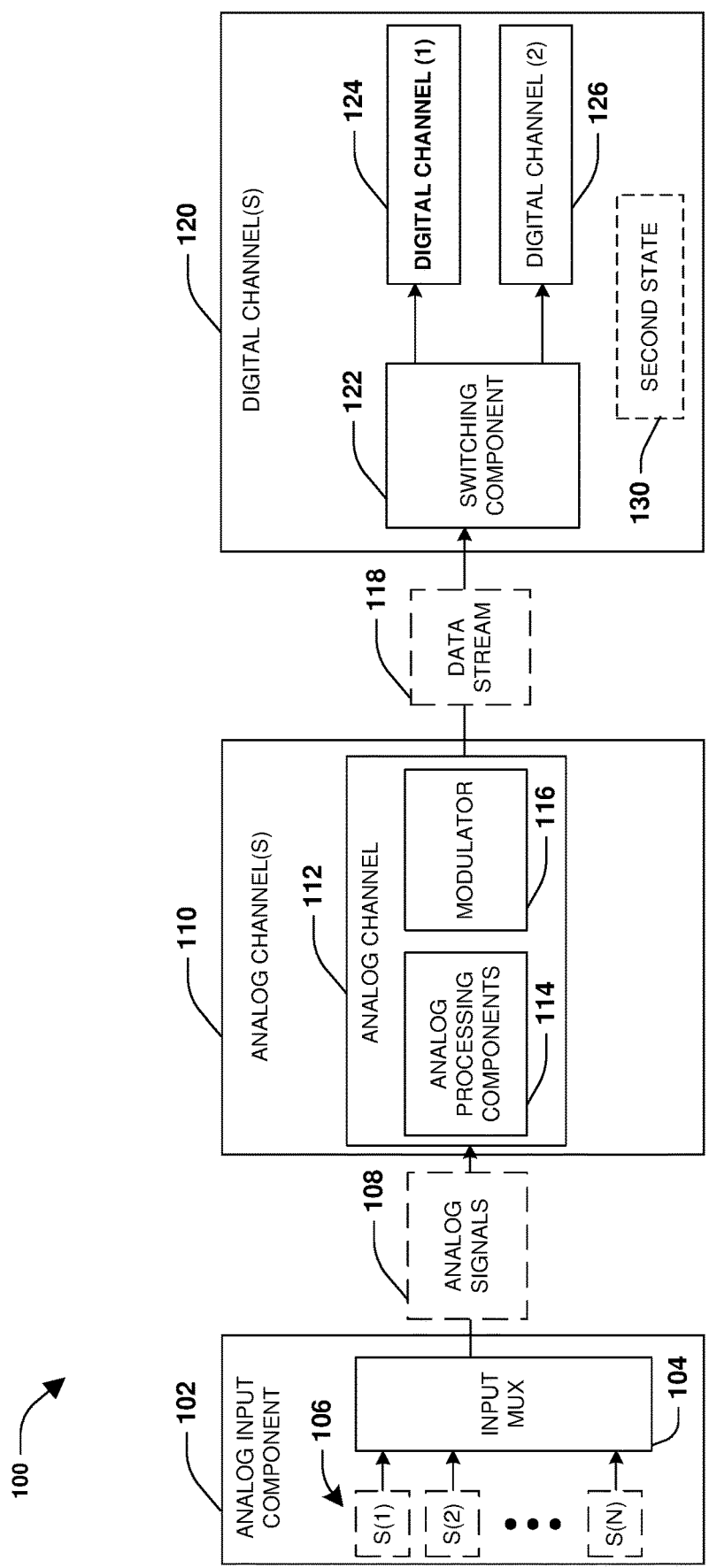
FIG. 1D is a component block diagram illustrating an example analog-to-digital converter system with a floating digital channel configuration, where a data stream is routed to a second digital channel, according to some embodiments.

FIG. 1B illustrates the switching component 122 switching the data stream 118 from being input into the first digital channel 124 to being input into the second digital channel 126. Before the data stream 118 is switched, a first state 128 of the first digital channel 124, such as a decimator state of the first decimator, a filter state of a filter component, etc., is saved. Once the first state 128 has been saved, then a switching state of the switching component 122 may be modified to switch the data stream 118 from being input into the first digital channel 124 to being input into the second digital channel 126.

In some embodiments, the switching from the first digital channel 124 to the second digital channel 126 also pertains to switching between source channels. For example, the first digital channel 124 may have been used to process a first type of data measured from a first source channel, and thus the analog signals 108 and the data stream 118 corresponded to the first type of data. For example, the first digital channel 124 was used to process voltage measurements. As part of switching to the second digital channel 126, the input multiplexor 104 may be controlled to switch from the first source channel to a second source channel associated with a second type of measured data, and thus the analog signals 108 and the data stream 118 will now correspond to the second type of data. For example, the second digital channel 126 will now be used to process temperature measurements. Because the source channel and thus the type of data being measured is being changed, the input may be blanked to hide/reduce noise experienced by the one or more digital channels 120 that would otherwise be experienced due to switching from the first source channel to the second source channel as the input. This prevents data from data stream 118, corresponding to the first type of measured analog signal from the first source channel that was being processed by the first digital channel 124, from being input into the second digital channel 126. Second digital channel 126 instead processes the second type of measured analog signal from the second source channel. In some embodiments, this may be achieved by implementing one or more blanking intervals before associating the data stream 118 with the second digital channel 126. For example, the one or more blanking intervals correspond to one or more intervals where data of the data stream 118 is not input into the digital channels 120 because the data stream 118 may still comprise some of the first type of data that is not to be processed by the second digital channel 126.

Once the switching component 122 has switched to inputting the data stream 118 comprising the second type of data of the second source channel (e.g., temperature data) to the second digital channel 126, a second decimator of the second digital channel 126 may convert the data stream 118. The second digital channel 126 may convert the data stream 118 from having the first resolution and the first sample rate to a second output stream having a third resolution and third sample rate. In some embodiments, the third resolution and/or the third sample rate may be different than the first resolution and/or the first sample rate of the data stream 118. In some embodiments, the third resolution and/or the third sample rate may be different than the second resolution and/or the second sample rate of the first output stream what was output by the first decimator of the first digital channel 124. The second decimator and/or components of the second digital channel 126 may utilize one or more parameters (parameter values) that may differ from parameters (parameter values) that were used by the first decimator and/or components of the first digital channel 124.

Figure 10:
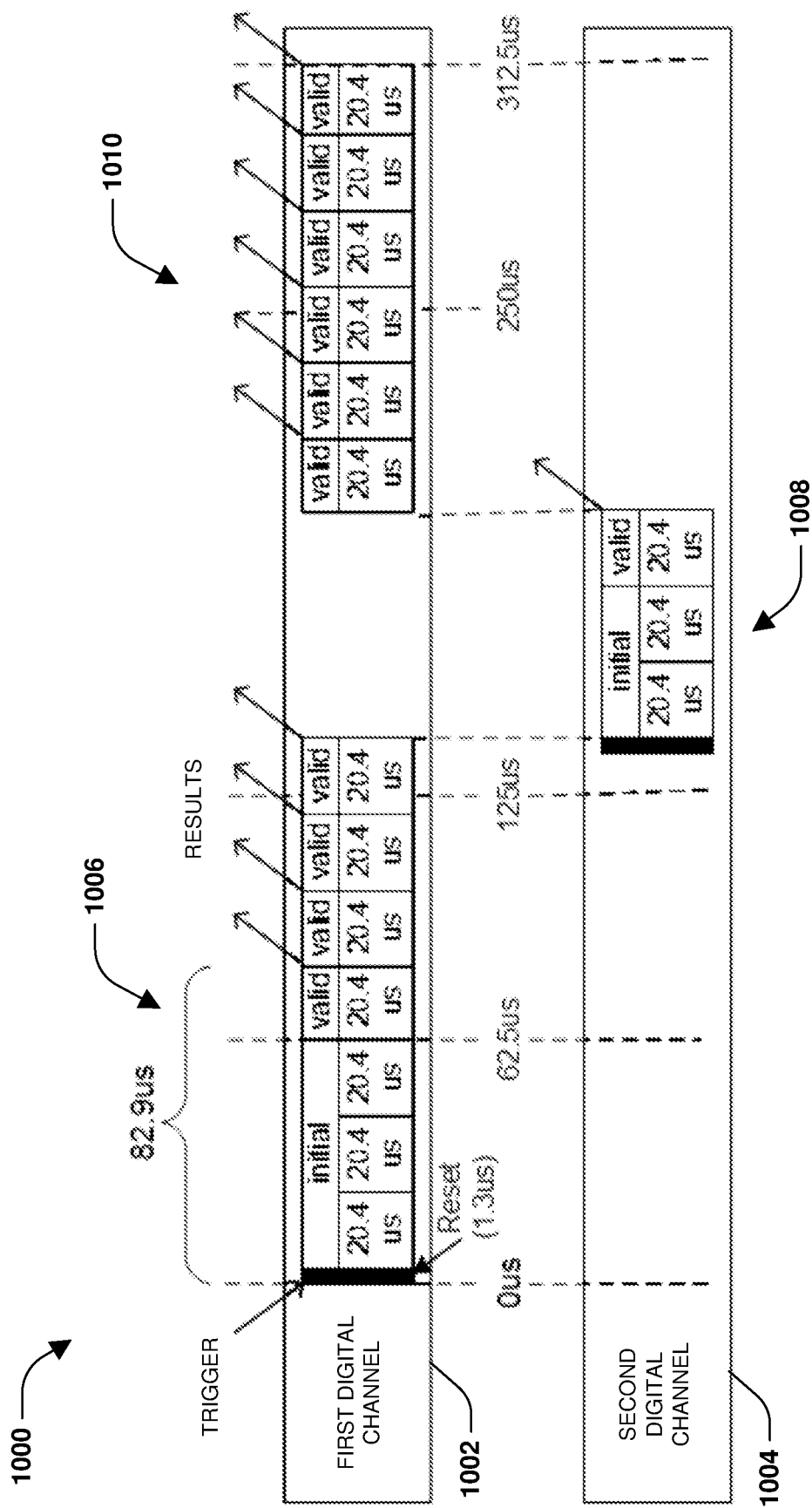
FIG. 10 is a component block diagram illustrating an example analog-to-digital converter system with a floating digital channel configuration, where a data stream is routed to a first digital channel, according to some embodiments.

FIG. 10 illustrates the switching component 122 switching the data stream 118 from being input into the second digital channel 126 to being input into the first digital channel 124. Before the data stream 118 is switched, a second state 130 of the second digital channel 126, such as a decimator state of the second decimator, a filter state of a second filter component of the second digital channel 126, etc., is saved. The first state 128 of the first digital channel 124 that was previously saved before the switching component 122 switched from the first digital channel 124 to the second digital channel 126 may be restored to the first digital channel 124. Once the first state 128 has been restored to the first digital channel 124 and the second state 130 has been saved, the switching state of the switching component 122 may modified to switch the data stream 118 from being input into the second digital channel 126 to being input into the first digital channel 124.

Figure 1D:
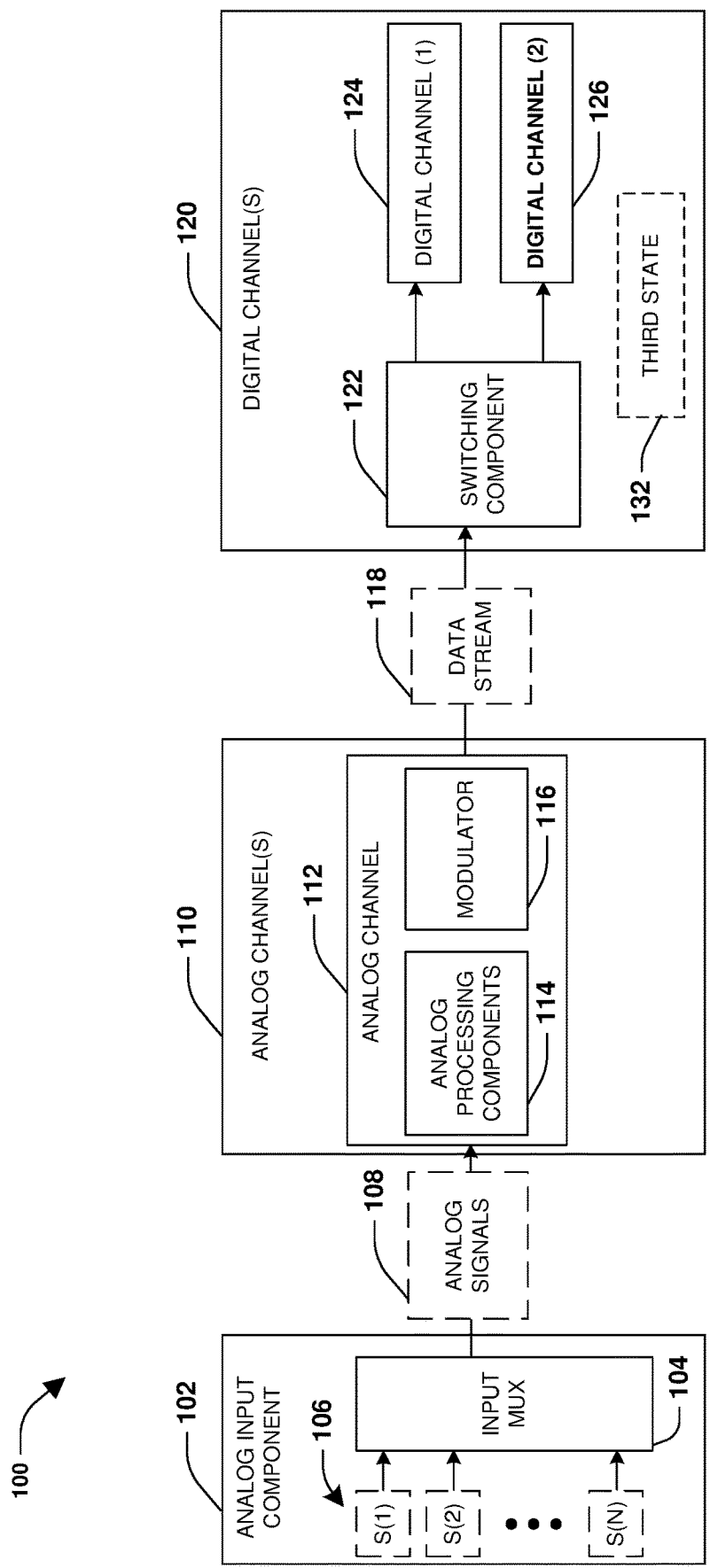

FIG. 1D illustrates the switching component 122 switching the data stream 118 from being input into the first digital channel 124 to being input into the second digital channel 126. Before the data stream 118 is switched, a third state 132 of the first digital channel 124, such as a decimator state of the first decimator, a filter state of the filter component, etc., is saved. The second state 130 of the second digital channel 126 that was previously saved before the switching component 122 switched from the second digital channel 126 to the first digital channel 124 may be restored to the second digital channel 126. Once the second state 130 has been restored to the second digital channel 126 and the third state 132 has been saved, the switching state of the switching component 122 may be modified to switch the data stream 118 from being input into the first digital channel 124 to being input into the second digital channel 126.

Figure 2:
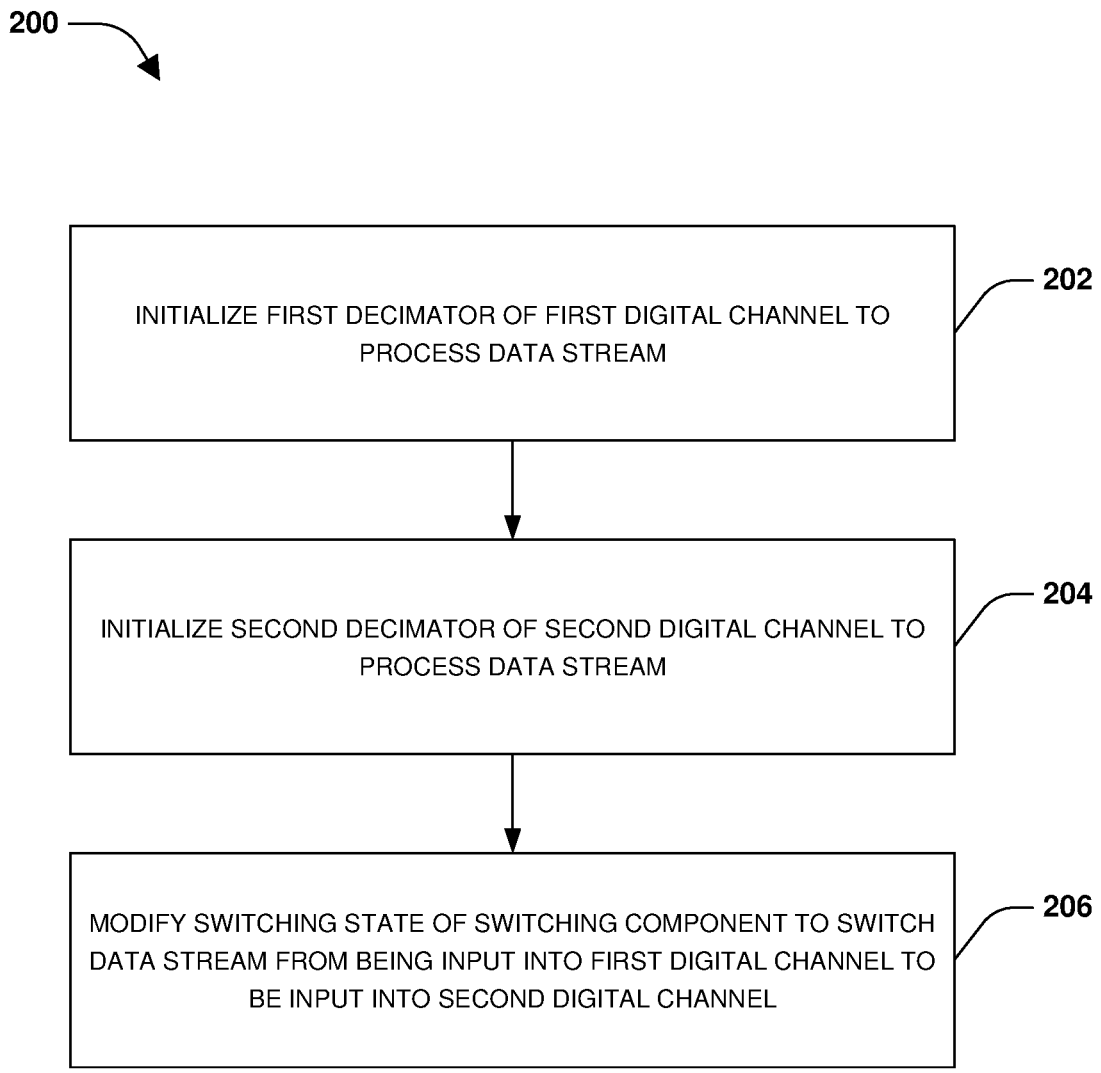
FIG. 2 is an illustration of an example method of controlling an analog-to-digital converter system with a floating digital channel configuration, according to some embodiments.

FIG. 2 illustrates an example of a method 200 for controlling a floating digital channel configuration of an analog-to-digital converter system, such as the analog-to-digital converter system 100 of FIGS. 1A-1D. The first digital channel 124 and the second digital channel 126 may be coupled to the switching component 122 that is connected to the analog channel 112.

During operation 202 of method 200, the first decimator of the first digital channel 124 is initialized to process the data stream 118. The data stream 118 input from the modulator 116 of the analog channel 110 through the switching component 122 to the first digital channel 124 based upon switching data of the switching component 122. In this way, the first digital channel 124 may process the data stream 118 input into the first decimator by the switching component 122.

A switching trigger may occur where the switching component 122 is to switch from inputting the data stream 118 into the first digital channel 124 to inputting the data stream 118 into the second digital channel. For example, the switching trigger may correspond to where a source channel being measured by the analog input component 102 is being changed from a first source channel associated with a first type of measured analog signals (e.g., voltage) being processed by the first digital channel 124 to a second source channel. The second source channel may be associated with a second type of measured analog signals (e.g., temperature)

to be processed by the second digital channel 126. Accordingly, during operation 204 of method 200, the second decimator of the second digital channel 126 may be initialized to process the data stream 118 that is input from the modulator 116 of the analog channel 110 through the switching component 122 to the second digital channel 126. As part of initializing the second decimator, if there is a saved state of the second decimator, then the saved state is restored to the second decimator. Because the source channel is being switched, one or more blanking intervals may be performed so that the first type of measured analog signals (e.g., voltage) of the first source channel that was being processed by the first digital channel 124 are not input into the second digital channel 126. Otherwise, the first type of measured analog signals would be noise because the second digital channel 126 is to process the second type of measured analog signals (e.g., temperature) of the second source channel. A state of the first decimator may be saved as a saved state.

During operation 206 of method 200, a switching state of the switching component 122 is modified to switch the data stream 118 from being input into the first digital channel to being input into the second digital channel 126. As previously described in relation to FIGS. 1A-1D, the switching state of the switching component 122 may be further modified one or more times to switch between the first digital channel 124 and the second digital channel by saving/storing states of a digital channel being switched away from and/or by restoring saved states to a digital channel being switched to by the switching component 122.

Figure 3:
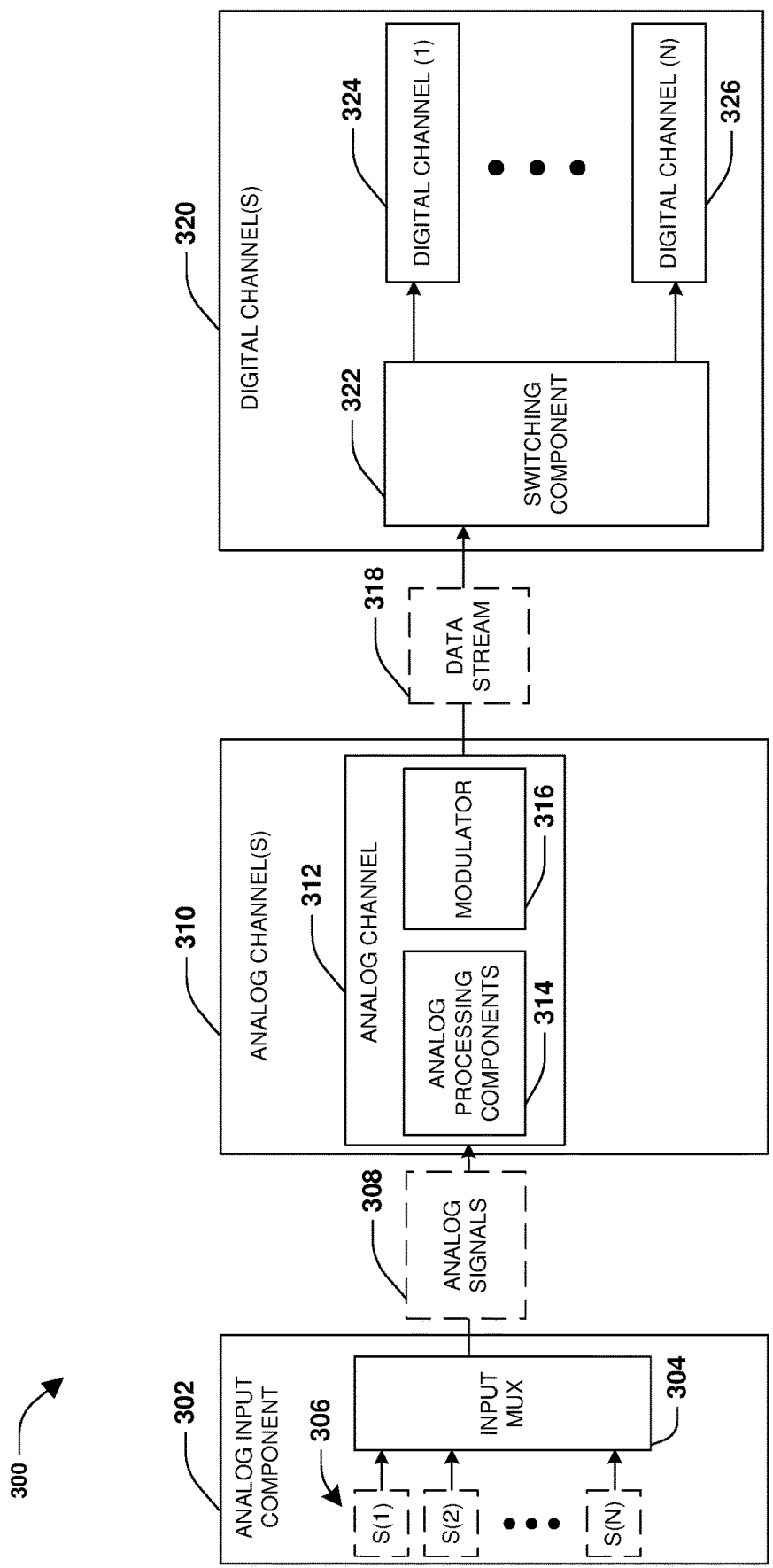
FIG. 3 is a component block diagram illustrating an example analog-to-digital converter system with a floating digital channel configuration with (N) digital channels, according to some embodiments.

FIG. 3 illustrates an analog-to-digital converter system 300 having a floating digital channel configuration. The analog-to-digital converter system 300 comprises an analog input component 302. The analog input component 302 may be configured to receive measured analog signals 306 from one or more source channels. The analog input component 302 is configured to output analog signals 308, corresponding to the measured analog signals 306, to one or more analog channels 310 of the analog-to-digital converter system 300 using an input multiplexor 304 to selectively output a measured analog signal of a particular source channel as the output analog signals 308. In some embodiments, the analog-to-digital converter system 300 comprises an analog channel 312 comprising analog processing components 314 and a modulator 316 such as a delta-sigma modulator that transforms the analog signals 308 into a data stream 318.

The data stream 318 is output from the modulator 316 to a switching component 322 associated with one or more digital channels 320 of the analog-to-digital converter system 300. In some embodiments, the one or more digital channels 320 comprise an integer number (N) of digital channels, such as a first digital channel 324 and/or any other number of digital channels such as a digital channel (N) 326. In this way, the data stream 318 from the analog channel 312 may be input by the switching component 322 to any of the one or more digital channels 320 of the analog-to-digital converter system 300 by modifying a switching state of the switching component 322.

Figure 4:
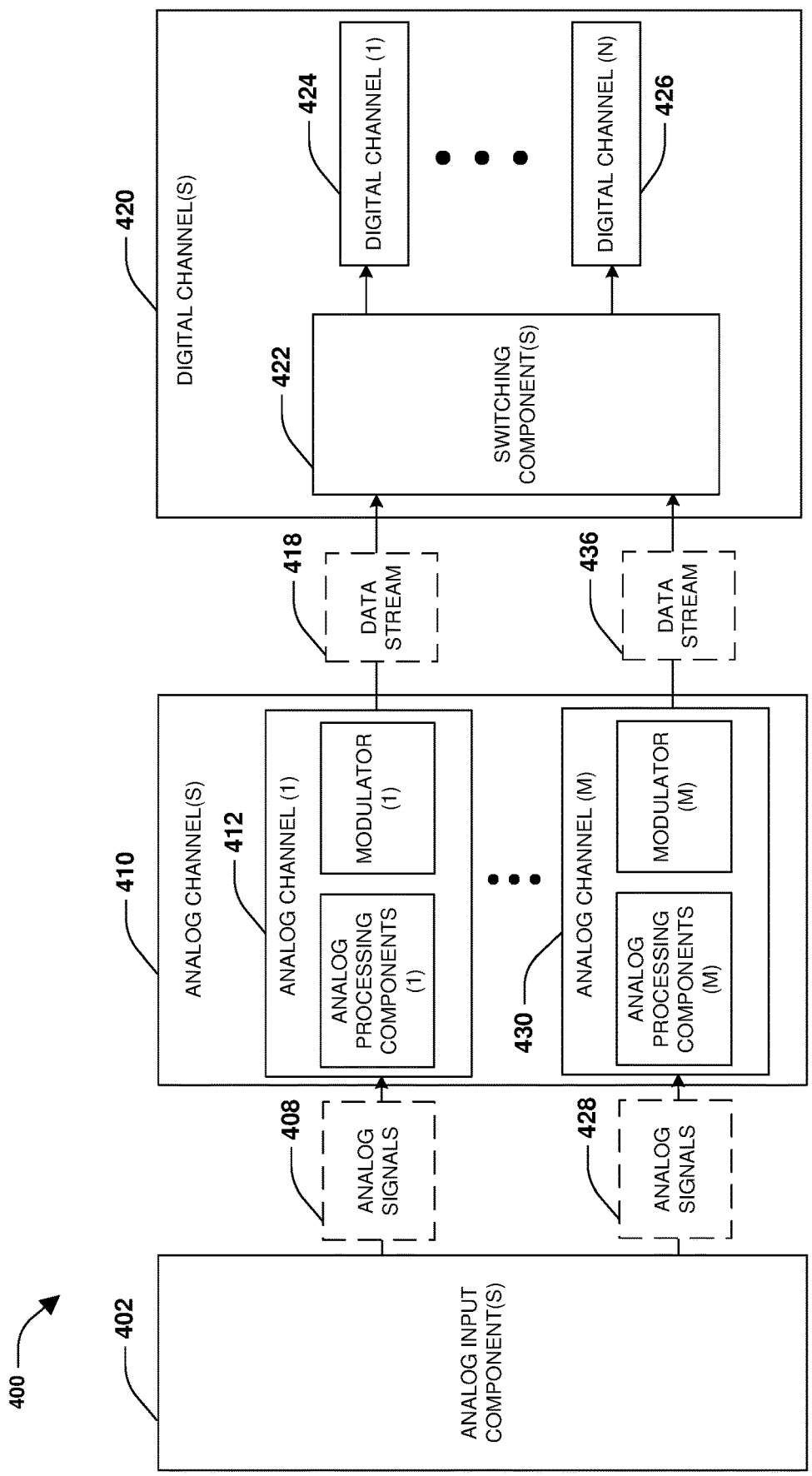
FIG. 4 is a component block diagram illustrating an example analog-to-digital converter system with (M) analog channels and a floating digital channel configuration with (N) digital channels, according to some embodiments.

FIG. 4 illustrates an analog-to-digital converter system 400 having a floating digital channel configuration. The analog-to-digital converter system 400 comprises one or more analog input components 402. The one or more analog input components 402 may be configured to receive measured analog signals from one or more source channels. The one or more analog input components 402 may be configured to output analog signals to one or more analog channels 410 of the analog-to-digital converter system 400 using input multiplexors to selectively output measured analog signals of particular source channels as output analog signals. In some embodiments, the analog-to-digital converter system 400 may comprise an integer number (M) of analog channels, such as a first analog channel 412 and/or any other number of analog channels such as an analog channel (M) 430. In some embodiments, a single analog input component of the one or more analog input components 402 may be connected to a single analog channel. For example, a first analog input component is connected to the first analog channel 412 in order to provide analog signals 408 to the first analog channel 412, an analog input component (M) is connected to the analog channel (M) 430 in order to provide analog signals 428 to the analog channel (M) 430, etc. In some embodiments, a single analog input component of the one or more analog input components 402 may be connected to more than one analog channel.

In some embodiments, one or more analog channels 410 may be connected to one or more switching components 422 associated with one or more digital channels 420 of the analog-to-digital converter system 400. In some embodiments, the one or more digital channels 420 comprise an integer number (N) of digital channels, such as a first digital channel 424 and/or any other number of digital channels such as a digital channel (N) 426. In some embodiments, certain analog channels may be associated with certain digital channels through certain switching components. In some embodiments, a digital channel may be associated with multiple analog channels, and thus the digital channel may be switched, such by a switch component, amongst the multiple analog channels for processing different data streams of the multiple analog channels. For example, a single digital channel is floated amongst the multiple analog channels. In this way, data streams from the one or more analog channels 410, such as a data stream 418 of the first analog channel 412 and a data stream 436 of the analog channel (M) 430 may be input by the one or more switching components 422 to select digital channels 420 of the analog-to-digital converter system 400. This is achieved by modifying switching states of the one or more switching components 422.

Figure 5A:
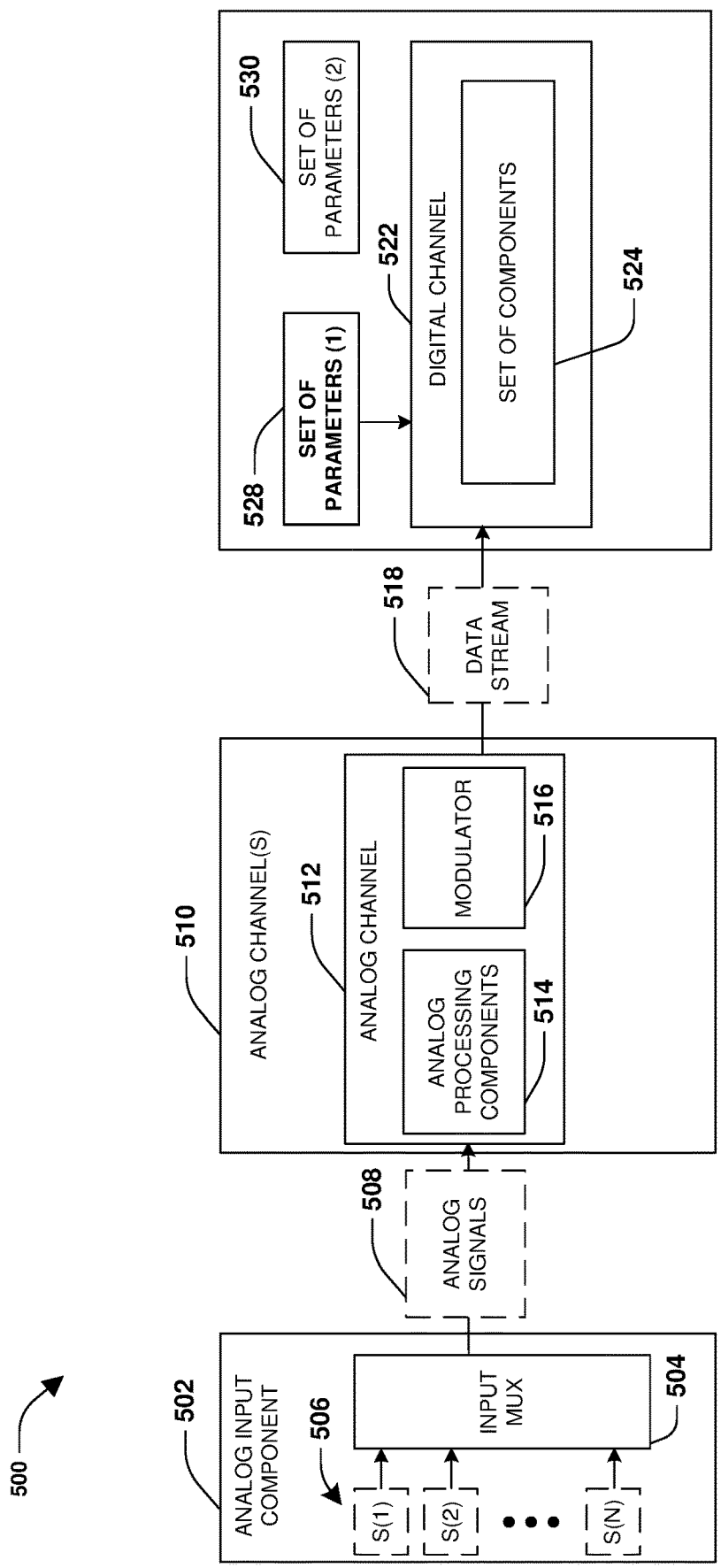
FIG. 5A is a component block diagram illustrating an analog-to-digital converter example system with a floating digital channel configuration having a first virtual digital channel and a second virtual digital channel, according to some embodiments.
Figure 5B:
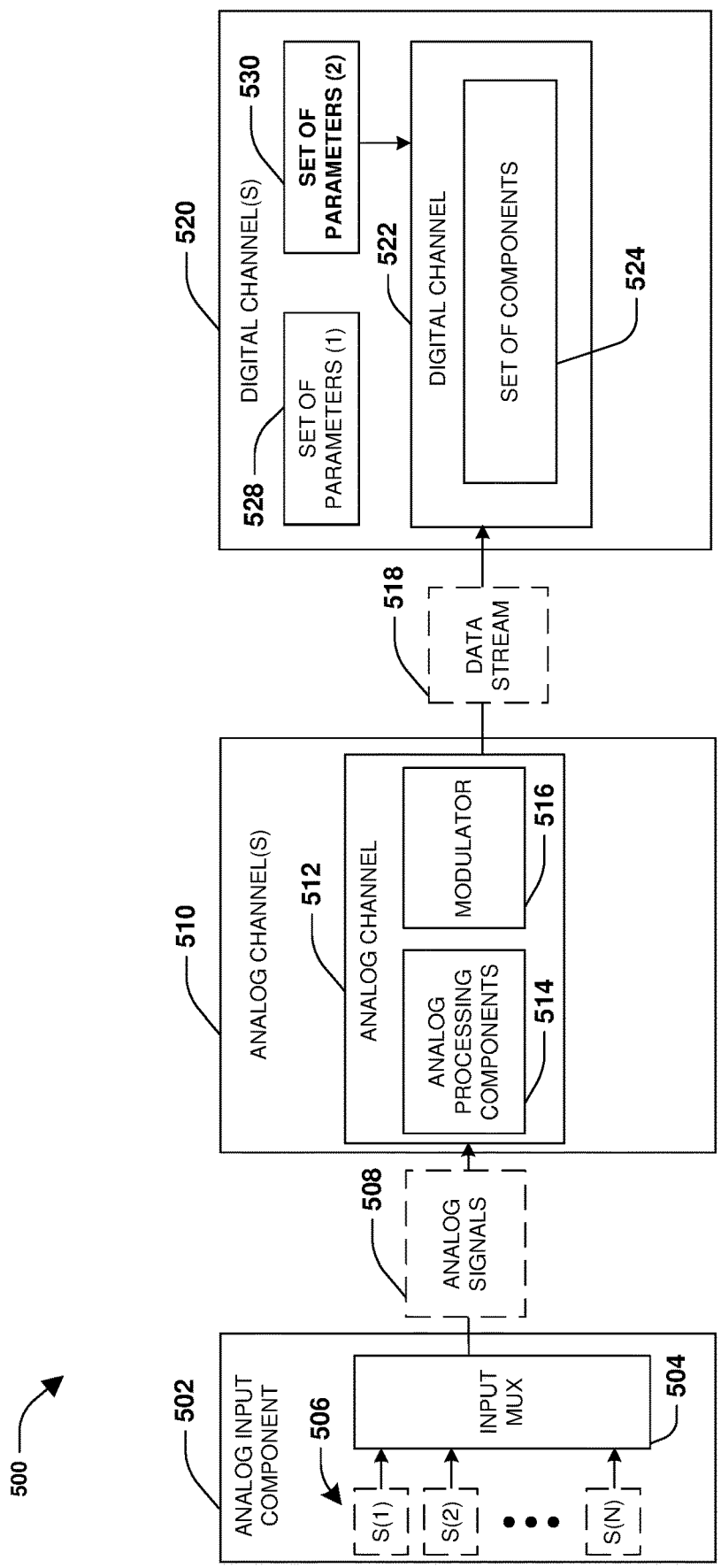
FIG. 5B is a component block diagram illustrating an example analog-to-digital converter system with a floating digital channel configuration having a first virtual digital channel and a second virtual digital channel, according to some embodiments.

FIGS. 5A and 5B illustrate an analog-to-digital converter system 500 having a floating digital channel configuration. The analog-to-digital converter system 500 comprises an analog input component 502. The analog input component 502 may be configured to receive measured analog signals 506 from one or more source channels. The analog input component 502 is configured to output analog signals 508, corresponding to the measured analog signals 506, to one or more analog channels 510 of the analog-to-digital converter system 500 using an input multiplexor 504 to selectively output a measured analog signal of a particular source channel as the output analog signals 508. In some embodiments, the analog-to-digital converter system 500 comprises an analog channel 512 comprising analog processing components 514 and a modulator 516 such as a delta-sigma modulator that transforms the analog signals 508 into a data stream 518.

The data stream 518 is output from the modulator 516 to a digital channel 522. The digital channel 522 may comprise a set of components 524 configured to process the data stream 518, such as a decimator, a compensation component, a filter component, a threshold comparison component, and/or any other type or number of components, to create a digital output. The set of components 524 may operate based upon parameters, such as decimator control parameters, offset and gain coefficient parameters, filter control parameters, comparison coefficient parameters, etc. A first set of parameters 528 may be used to control the set of components 524 of the digital channel 522 to function as a first virtual digital channel that performs a first type of processing upon the data stream 518. For example, the first type of processing may correspond to converting a measured voltage signal into a digital signal of voltage measurements. A second set of parameters 530 may be used to control the set of components 524 of the digital channel 522 to function as a second virtual digital channel that performs a second type of processing upon the data stream 518. For example, the second type of processing may correspond to converting a measured temperature signal into a digital signal of temperature measurements. In some embodiments, at least one parameter (parameter value) of the first set of parameters 528 may differ from parameters (parameter values) of the second set of parameters 530.

In some embodiments, the virtual digital channels share common digital elements, such as the set of components 524 of the digital channel 522 that is shared by the virtual digital channels. For example, the first virtual channel and the second virtual channel share the same decimator, compensation component, filter component, threshold comparison component, and/or other components. However, the virtual digital channels can process the data stream 518 differently from one another because different sets of parameters (different parameter values) may be applied to those shared common digital elements for reach virtual digital channel. In some embodiments, the sets of parameters may be stored within separate control registers that may be connected to each component of the set of components 524 through multiplexors. For example, control registers comprising a decimator control parameter of the first set of parameters 528 and a decimator control parameter of the second set of parameters 530 may be connected to the shared decimator through a multiplexor. Control registers comprising an offset and gain coefficient parameter of the first set of parameters 528 and an offset and gain coefficient parameter of the second set of parameters 530 may be connected to the shared compensation component through a multiplexor. Control registers comprising a filter control parameter of the first set of parameters 528 and a filter control parameter of the second set of parameters 530 may be connected to the shared filter component through a multiplexor. Control registers comprising a comparison coefficient parameter of the first set of parameters 528 and a comparison coefficient parameter of the second set of parameters 530 may be connected to the shared threshold compensation component through a multiplexor. In some embodiments, optional state storage may be provided for one or more of the components of the set of components 524, such as decimator state storage for the decimator, filter/accumulator state storage for the filter component, etc. In some embodiments, the optional state storage may be used to store state information relating to the decimator control parameters 712, the offset and gain coefficient parameters 714, the filter control parameters 716, and/or the comparison coefficient parameters 718 illustrated by FIG. 7.

FIG. 5A illustrates the first set of parameters 528 of the first virtual digital channel being input into the set of components 524 to control the digital channel 522 to perform a first type of processing associated with the first virtual digital channel. For example, the first virtual digital channel may be configured to process voltage measurements, and thus the first set of parameters 528 may be tailored to control the set of components 524 to process the voltage measurements within the data stream 518. In some embodiments, multiplexors connected to the control registers storing the parameters of the first set of parameters 528 and the second set of parameters 530 may be controlled to connect control registers comprising the first set of parameters 528 to the set of components 524.

FIG. 5B illustrates the second set of parameters 530 of the second virtual digital channel being input into the set of components 524 to control the digital channel 522 to perform a second type of processing associated with the second virtual digital channel. For example, the second virtual digital channel may be configured to process temperature measurements, and thus the second set of parameters 530 may be tailored to control the set of components 524 to process the temperature measurements within the data stream 518. In some embodiments of switching from inputting the first set of parameters 528 to inputting the second set of parameters 530 to the set of components 524, multiplexors connected to the control registers storing the parameters of the first set of parameters 528 and the second set of parameters 530 may be controlled to connect control registers comprising the second set of parameters 530 to the set of components 524.

Figure 6:
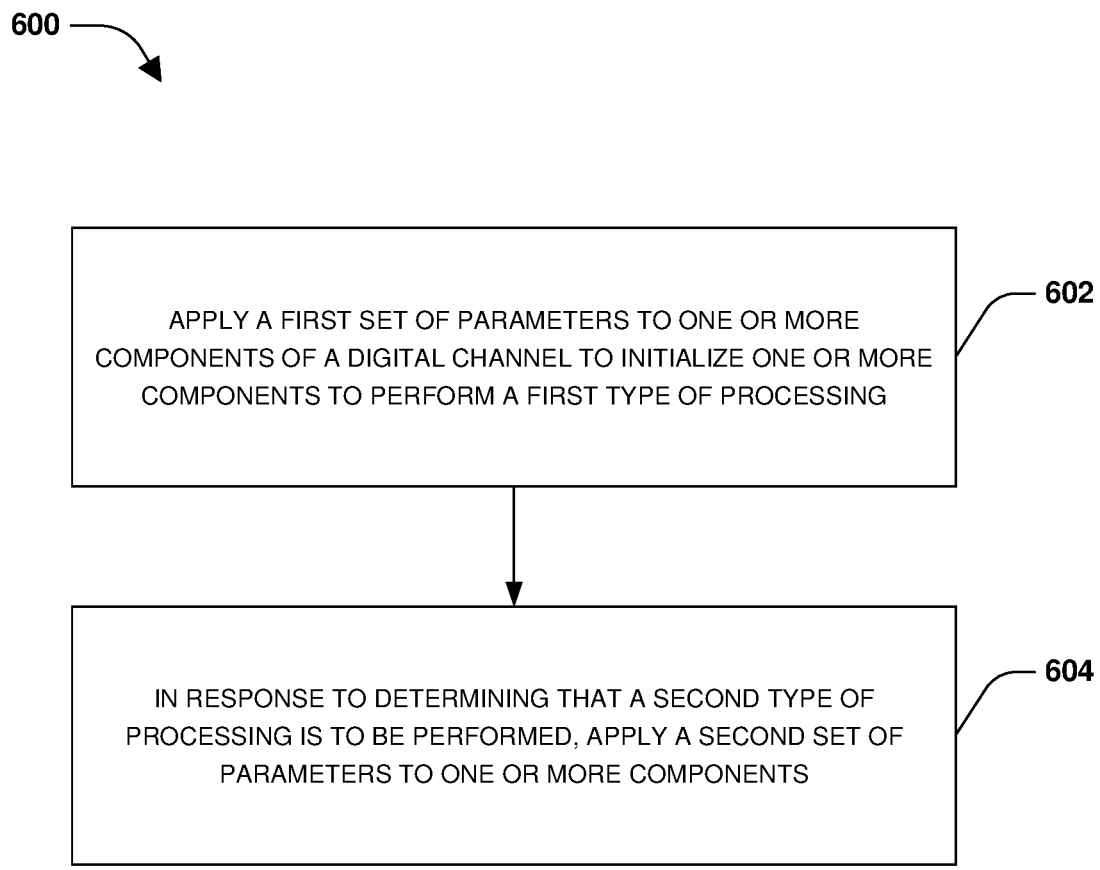
FIG. 6 is an illustration of an example method of controlling an analog-to-digital converter system with a floating digital channel configuration, according to some embodiments.

FIG. 6 illustrates an example of a method 600 for controlling a floating digital channel configuration of an analog-to-digital converter system, such as the analog-to-digital converter system 500 of FIGS. 5A and 5B. During operation 602 of method 600, the first set of parameters 528 are applied to one or more components, such as the set of components 524, of the digital channel 522 to initialize the set of components 524 to perform a first type of processing upon the data stream 518 input into the digital channel 522 by the modulator 516 of the analog channel 512. In some embodiments, the first set of parameters 528 are tuned to process a first type of data received through the data stream 518.

During operation 604 of method 600, in response to determining that the set of components 524 are to perform a second type of processing upon the data stream 518, the second set of parameters 530 are applied to the set of components 524. The second set of parameter 530 are applied to initialize the set of components 524 to perform the second type of processing upon the data stream 518. In some embodiments, the second set of parameters 530 comprises at least one parameter (parameter value) different than parameters (parameter values) of the first set of parameters 528. For example, the first set of parameters 528 comprises a first set of decimator control parameters and the second set of parameters 530 comprises a second set of decimator control parameters. At least one decimator control parameter (decimator control parameter value) may be different than decimator control parameters (decimator control parameter values) of the first set of decimator control parameters. In some embodiments, the second set of parameters 530 are tuned to process a second type of data received through the data stream 518.

In some embodiments, before the set of components 524 are initialized with the second set of parameters 530, the states of one or more of the set of components 524 may be optionally stored (e.g., a decimator state of a decimator, a filter state of a filter component, etc.), and the states are cleared from the one or more components after being stored. After the states are stored, then the set of components 524 are initialized with the second set of parameters 530. When the set of components 524 are subsequently initialized with the first set of parameters 528, the stored states may be restored back to the one or more components.

Figure 8:
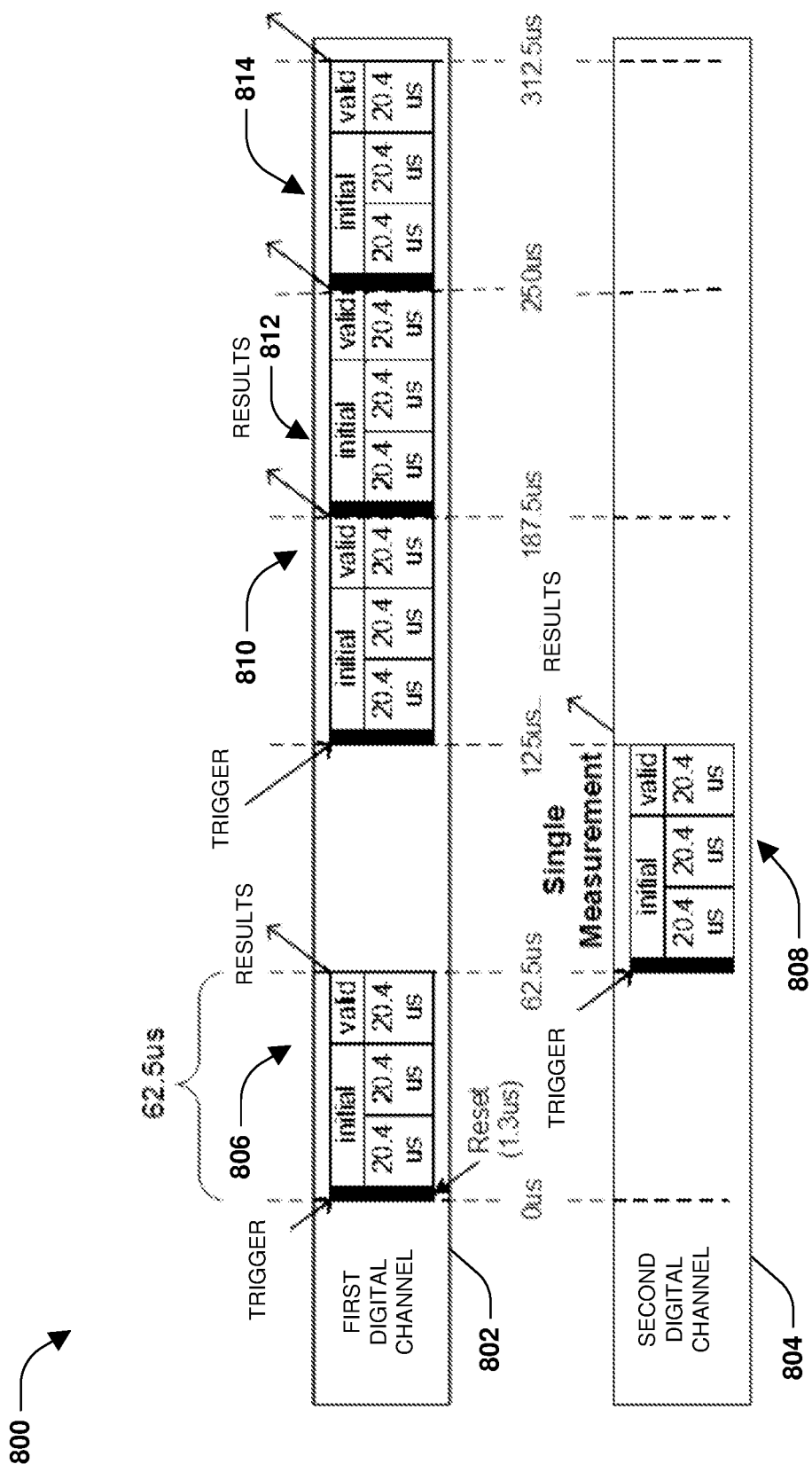
FIG. 8 is an illustration of an example timing diagram, according to some embodiments.

FIG. 8 illustrates an example timing diagram 800 associated with an analog-to-digital converter system implementing a floating digital channel. The timing diagram 800 may represent time intervals of 62.5 μs associated with first digital channel measurements 802 of a first digital channel and second digital channel measurements 804 of a second digital channel. Initially, a data stream from an analog channel of the analog-to-digital converter system may be processed by the first digital channel by a single measurement 806 that is triggered at Ops with results available at 62.5 μs. After the single measurement 806 is performed by the first digital channel, the data stream is processed by the second digital channel by a single measurement 808 that is triggered at 62.5 μs with results available at 125 μs. After the single measurement 808 is performed by the second digital channel, back-to-back measurements are performed by the first digital channel upon the data stream, such as a measurement 810 starting at 125 μs with results at 187.5 μs, a measurement 812 starting at 187.5 μs with results at 250 μs, a measurement 814 starting at 250 μs with results at 312.5 μs, etc. In this way, the second digital channel may be utilized to perform occasional single shot measurements of the data stream.

Figure 9:
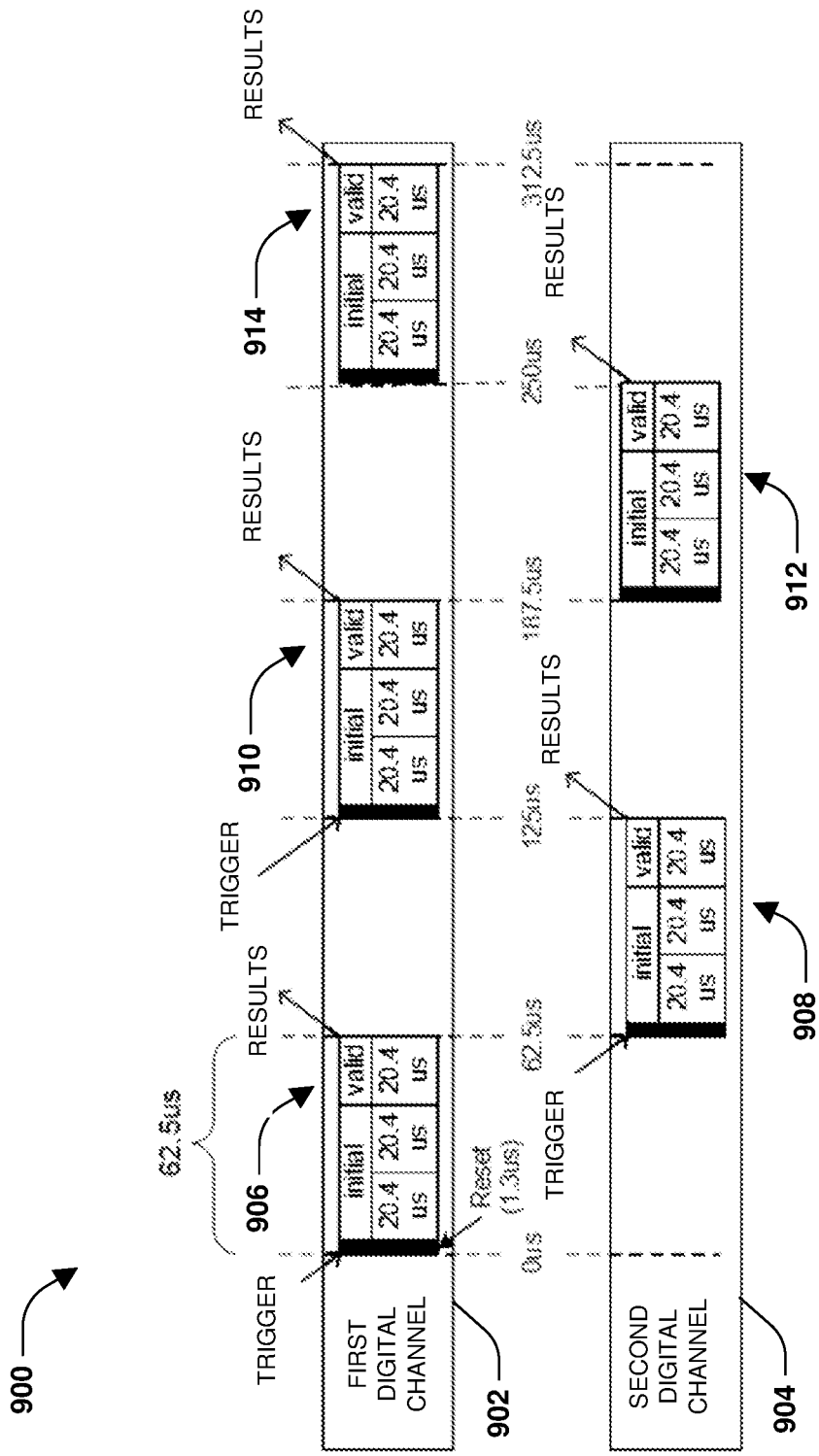
FIG. 9 is an illustration of an example timing diagram, according to some embodiments.

FIG. 9 illustrates an example timing diagram 900 associated with an analog-to-digital converter system implementing a floating digital channel. The timing diagram 900 may represent time intervals of 62.5 μs associated with first digital channel measurements 902 of a first digital channel and second digital channel measurements 904 of a second digital channel. Initially, a data stream from an analog channel of the analog-to-digital converter system may be processed by the first digital channel by a single measurement 906 that is triggered at Ops with results available at 62.5 μs. After the single measurement 906 is performed by the first digital channel, the data stream is processed by the second digital channel by a single measurement 908 that is triggered at 62.5 μs with results available at 125 μs. After the single measurement 908 is performed by the second digital channel, the first digital channel performs a single measurement 910 upon the data stream that is triggered at 125 μs with results available at 187.5 μs. After the single measurement 910 is performed by the first digital channel, the second digital channel performs a single measurement 912 upon the data stream that is triggered at 187.5 μs with results available at 250 μs. After the single measurement 912 is performed by the second digital channel, the first digital channel performs a single measurement 914 upon the data stream that is triggered at 250 μs with results available at 312.5 μs. In this way, alternating measurements of the data stream may be performed by the first digital channel and the second digital channel.

FIG. 10 illustrates an example timing diagram 1000 associated with an analog-to-digital converter system implementing a floating digital channel. The timing diagram 1000 may represent time intervals of 62.5 μs associated with first digital channel measurements 1002 of a first digital channel and second digital channel measurements 1004 of a second digital channel. Initially, a data stream from an analog channel of the analog-to-digital converter system may be processed by the first digital channel by a series of continuous measurements 1006 triggered at Ops with results available starting around 82.9 μs. After the series of continuous measurements 1006 are performed by the first digital channel, the data stream is processed by the second digital channel by a single measurement 1008. In some embodiments, a filter state of a filter component of the first digital channel is stored/preserved while the single measurement 1008 is performed by the second digital channel. After the single measurement 1008 is performed by the second digital channel, the first digital channel performs a series of continuous measurements 1010 upon the data stream. In some embodiments, the filter state is restored to the filter component as part of switching to the first digital channel to perform the series of continuous measurements 1010. In this way, series of continuous measurements may be performed by the first digital channel with occasional single shot measurements by the second digital channel.

Figure 11:
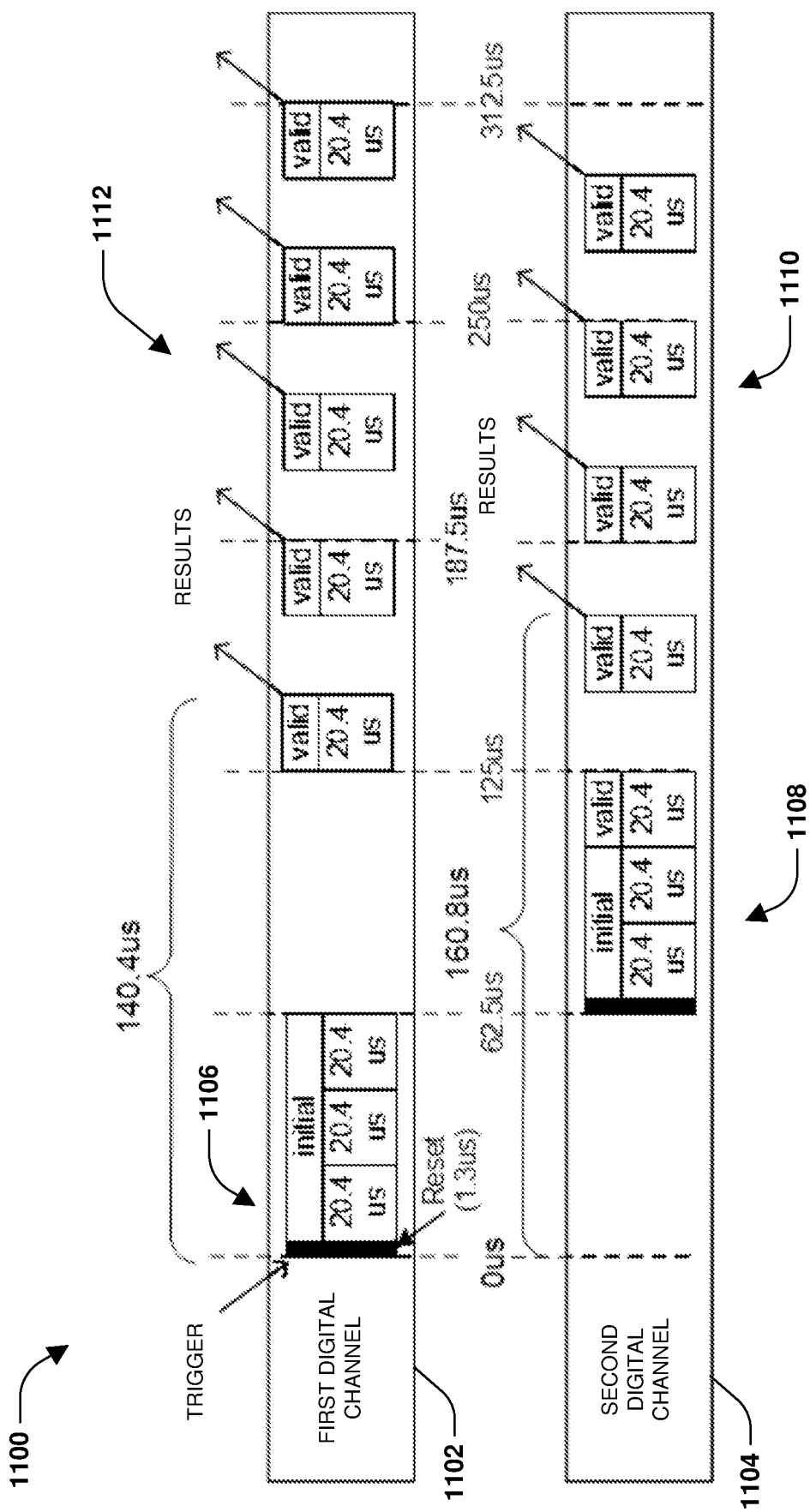
FIG. 11 is an illustration of an example timing diagram, according to some embodiments.

FIG. 11 illustrates an example timing diagram 1100 associated with an analog-to-digital converter system implementing a floating digital channel. The timing diagram 1100 may represent time intervals of 62.5 μs associated with first digital channel measurements 1102 of a first digital channel and second digital channel measurements 1104 of a second digital channel. At time Ops, the first digital channel may be initialized 1106 to perform measurements of a data stream from an analog channel of the analog-to-digital converter system. At time 62.5 μs, the second digital channel may be initialized 1108 with results of a measurement available at 125 μs. After, the first digital channel may perform a series of measurements 1112 of the data stream that are interleaved with the second digital channel performing a series of measurements 1110 of the data stream. In some embodiments, two decimators or storage of two decimator states are used to enable the series of interleaved measurements 1112, 1110 on both digital channels. In some embodiments, two filter components or storage of two filter states are used to enable the series of interleaved measurements 1112, 1110 on both digital channels.

Figure 12:
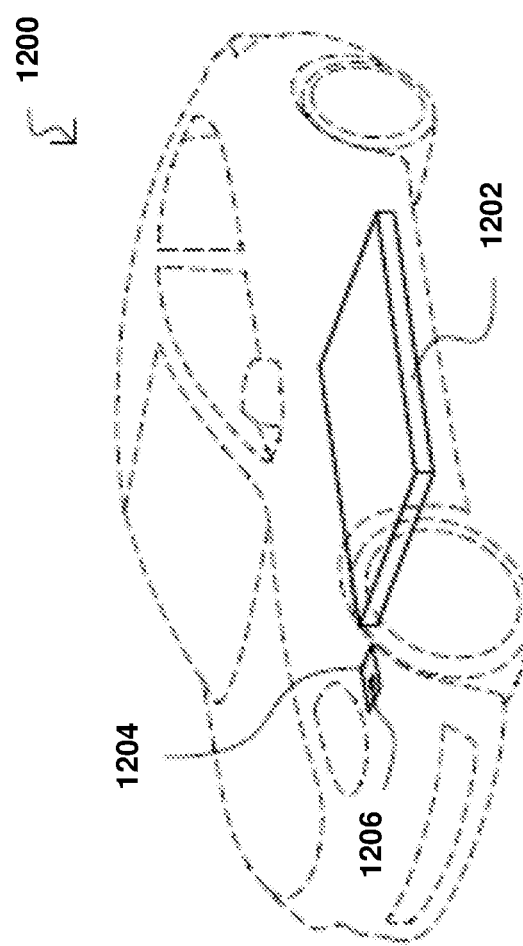
FIG. 12 is an illustration of an example use case scenario, according to some embodiments.

FIG. 12 is a diagram of an automobile system 1200 according to some embodiments. The automobile system 1200 can include a battery 1202 and an intelligent battery sensor 1204. The intelligent battery sensor 1204 can include an analog-to-digital converter system 1206. The analog-to-digital converter system 1206 can take the form of any of those described herein, or equivalents, and can generate digital signals corresponding to operations of battery 1202, including by not limited to terminal voltage, charge current, discharge current, etc.

It may be appreciated that the systems and techniques described herein may relate to any type of converter or signal processing device that may receive an input signal, convert or process the input signal, and/or output an output signal. The signals that are being processed or converted may be any type of signals, such as analog signals, digital signals, etc. In some embodiments, the systems and techniques described herein may be applicable to an analog-to-digital converter, a delta-sigma modulator, or any other type of converter or signal processing component.

According to some embodiments, a system is provided. The system includes an analog input component configured to receive measured analog signals and output analog signals, corresponding to the measured analog signals, to a first analog channel coupled to the analog input component; and the first analog channel coupled to a switching component connected to a first digital channel and a second digital channel, wherein the first analog channel comprises a modulator configured to convert the analog signals into a data stream selectively input by the switching component to the first digital channel or the second digital channel.

According to some embodiments, the first analog channel is coupled to one or more additional digital channels through the switching component.

According to some embodiments, the system comprises a second analog channel coupled to at least one of the first digital channel, the second digital channel, or one or more additional digital channels through the switching component.

According to some embodiments, the first digital channel comprises a first decimator configured to convert the data stream from having a first resolution and a first sample rate to a first output data stream having a second resolution and a second sample rate different than the first resolution and the first sample rate.

According to some embodiments, after the first decimator converts the data stream to the first output data stream, a first state of the first decimator is stored and the data stream is switched from being input into the first digital channel to being input into the second digital channel for processing by a second decimator of the second digital channel to convert the data stream from having the first resolution and the first sample rate to a second output data stream having a third resolution and a third sample rate different than the first resolution and the first sample rate.

According to some embodiments, after the second decimator converts the data stream to the second output data stream, a second state of the second decimator is stored and the data stream is switched from being input into the second digital channel to being input into the first digital channel for processing by the first decimator.

According to some embodiments, the first digital channel comprises a first component configured to perform a function that processes the data stream based upon a first set of parameters, and wherein the second digital channel comprises a second component configured to perform a second function to process the data stream based upon a second set of parameters, wherein the second set of parameters comprises at least one parameter different than parameters of the first set of parameters.

According to some embodiments, the first component comprises at least one of a decimator configured to utilize decimation control parameters as the first set of parameters, a compensation component configured to utilize offset and gain coefficient parameters as the first set of parameters, a filter component configured to utilize filter control parameters as the first set of parameters, or a threshold comparison component configured to utilize comparison coefficient parameters as the first set of parameters.

According to some embodiments, a method is provided. The method includes initializing a first decimator, of a first digital channel coupled to a switching component connected to an analog channel, to process a data stream input from a modulator of the analog channel through the switching component to the first digital channel; initializing a second decimator, of a second digital channel coupled to the switching component connected to the analog channel, to process the data stream input from the modulator of the analog channel through the switching component to the second digital channel; and modifying a switching state of the switching component to switch the data stream from being input into the first digital channel to being input into the second digital channel after the switching state of the switching component inputs the data stream into the first digital channel.

According to some embodiments, the method includes in response to determining that the data stream is to be switched from being input into the first digital channel to being input into the second digital channel: storing a first state of the first decimator; and modifying the switching state of the switching component to switch the data stream from being input into the first digital channel to being input into the second digital channel.

According to some embodiments, the method includes in response to determining that the data stream is to be switched from being input into the second digital channel to being input into the first digital channel a second time: storing a second state of the second decimator; and modifying the switching state of the switching component to switch the data stream from being input into the second digital channel to being input into the first digital channel.

According to some embodiments, the method includes in response to determining that the data stream is to be switched from being input into the first digital channel the second time to being input into the second digital channel a second time: storing a third state of the first decimator; and modifying the switching state of the switching component to switch the data stream from being input into the first digital channel to being input into the second digital channel.

According to some embodiments, the initializing the second decimator comprises: restoring a saved state of the second decimator to the second decimator.

According to some embodiments, the method includes in response to determining that the data stream is to be switched from being input into the first digital channel to being input into the second digital channel, implementing one or more blanking intervals before modifying the switching state of the switching component to switch the data stream from being input into the first digital channel to being input into the second digital channel.

According to some embodiments, the method includes switching the first digital channel from processing the data stream of the analog channel to processing a different data stream of a different analog channel.

According to some embodiments, a method is provided. The method includes applying a first set of parameters to a component of a digital channel to initialize the component to perform a first type of processing upon a data stream input into the digital channel by a modulator of an analog channel; and in response to determining that the component is to perform a second type of processing upon the data stream, applying a second set of parameters, comprising at least one parameter different than parameters of the first set of parameters, to the component to initialize the component to perform the second type of processing upon the data stream.

According to some embodiments, the component comprises a decimator, wherein the first set of parameters comprises a first set of decimator control parameters, and wherein the second set of parameters comprises a second set of decimator control parameters comprising at least one decimator control parameter different than decimator control parameters of the first set of decimator control parameters.

According to some embodiments, the first set of parameters are tuned to process a first type of data by the component and the second set of parameters are tuned to process a second type of data by the component.

According to some embodiments, the method includes in response to determining that the component is to perform the second type of processing upon the data stream, storing a first state of the component as a first stored state and clearing the first state of the component.

According to some embodiments, the method includes in response to determining that the component is to perform the first type of processing upon the data stream after determining that the component is to perform the second type of processing upon the data stream, restoring the first stored state to the component to initialize the component to perform the first type of processing upon the data stream.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

As used in this application, the terms "component," "module," "system", "interface", and the like are generally intended to refer to a computer-related entity, either hardware, a combination of hardware and software, software, or software in execution. One or more components may be localized on one computer and/or distributed between two or more computers.

Furthermore, the claimed subject matter may be implemented as a method, apparatus, or article of manufacture using standard programming and/or engineering techniques to produce software, firmware, hardware, or any combination thereof to control a computer to implement the disclosed subject matter. The term "article of manufacture" as used herein is intended to encompass a computer program accessible from any computer-readable device, carrier, or media. Of course, those skilled in the art will recognize many modifications may be made to this configuration without departing from the scope or spirit of the claimed subject matter.

Various operations of embodiments are provided herein. In one embodiment, one or more of the operations described may constitute computer readable instructions stored on one or more computer readable media, which if executed by a computing device, will cause the computing device to perform the operations described. The order in which some or all of the operations are described should not be construed as to imply that these operations are necessarily order dependent. Alternative ordering will be appreciated by one skilled in the art having the benefit of this description. Further, it will be understood that not all operations are necessarily present in each embodiment provided herein.

Any aspect or design described herein as an "example" is not necessarily to be construed as advantageous over other aspects or designs. Rather, use of the word "example" is intended to present one possible aspect and/or implementation that may pertain to the techniques presented herein. Such examples are not necessary for such techniques or intended to be limiting. Various embodiments of such techniques may include such an example, alone or in combination with other features, and/or may vary and/or omit the illustrated example.

As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims may generally be construed to mean "one or more" unless specified otherwise or clear from context to be directed to a singular form. Also, unless specified otherwise, "first," "second," or the like are not intended to imply a temporal aspect, a spatial aspect, an ordering, etc. Rather, such terms are merely used as identifiers, names, etc. for features, elements, items, etc. For example, a first element and a second element generally correspond to element A and element B or two different or two identical elements or the same element.

Also, although the disclosure has been shown and described with respect to one or more implementations, equivalent alterations and modifications will occur to others skilled in the art based upon a reading and understanding of this specification and the annexed drawings. The disclosure includes all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure which performs the function in the herein illustrated example implementations of the disclosure. In addition, while a particular feature of the disclosure may have been disclosed with respect to only one of several implementations, such feature may be combined with one or more other features of the other implementations as may be desired and advantageous for any given or particular application. Furthermore, to the extent that the terms "includes", "having", "has", "with", or variants thereof are used in either the detailed description or the claims, such terms are intended to be inclusive in a manner similar to the term "comprising."

What is claimed is:

1. A system, comprising:
    an analog input component configured to receive measured analog signals and output analog signals, corresponding to the measured analog signals, to a first analog channel coupled to the analog input component; and
    the first analog channel coupled to a switching component connected to a first digital channel and a second digital channel, wherein the first analog channel comprises a modulator configured to convert the analog signals into a data stream selectively input by the switching component to the first digital channel or the second digital channel, wherein the first digital channel comprises a first decimator configured to convert the data stream from having a first resolution and a first sample rate to a first output data stream having a second resolution and a second sample rate different than the first resolution and the first sample rate.

2. The system of claim 1, wherein the first analog channel is coupled to one or more additional digital channels through the switching component.

3. The system of claim 1, comprising:
    a second analog channel coupled to at least one of the first digital channel, the second digital channel, or one or more additional digital channels through the switching component.

4. The system of claim 1, wherein the first digital channel comprises a compensation component configured to utilize offset and gain coefficient parameters.

5. The system of claim 1, wherein, after the first decimator converts the data stream to the first output data stream, a first state of the first decimator is stored and the data stream is switched from being input into the first digital channel to being input into the second digital channel for processing by a second decimator of the second digital channel to convert the data stream from having the first resolution and the first sample rate to a second output data stream having a third resolution and a third sample rate different than the first resolution and the first sample rate.

6. The system of claim 5, wherein, after the second decimator converts the data stream to the second output data stream, a second state of the second decimator is stored and the data stream is switched from being input into the second digital channel to being input into the first digital channel for processing by the first decimator.

7. The system of claim 1, wherein the first digital channel comprises a first component configured to perform a function that processes the data stream based upon a first set of parameters, and wherein the second digital channel comprises a second component configured to perform a second function to process the data stream based upon a second set of parameters, wherein the second set of parameters comprises at least one parameter different than parameters of the first set of parameters.

8. The system of claim 7, wherein the first component comprises at least one of a compensation component configured to utilize offset and gain coefficient parameters as the first set of parameters, a filter component configured to utilize filter control parameters as the first set of parameters, or a threshold comparison component configured to utilize comparison coefficient parameters as the first set of parameters.

9. A method comprising:
    initializing a first decimator, of a first digital channel coupled to a switching component connected to an analog channel, to process a data stream input from a modulator of the analog channel through the switching component to the first digital channel;
    initializing a second decimator, of a second digital channel coupled to the switching component connected to the analog channel, to process the data stream input from the modulator of the analog channel through the switching component to the second digital channel; and
    in response to determining that the data stream is to be switched from being input into the first digital channel to being input into the second digital channel:
        storing a first state of the first decimator; and
        modifying a switching state of the switching component to switch the data stream from being input into the first digital channel to being input into the second digital channel after the switching state of the switching component inputs the data stream into the first digital channel.

10. The method of claim 9, comprising:
    storing a second state of the decimator based upon a determination that the data stream is to be switched from being input into the second digital channel to being input into the first digital channel.

11. The method of claim 9, comprising:
    in response to determining that the data stream is to be switched from being input into the second digital channel to being input into the first digital channel a second time:
        storing a second state of the second decimator; and
        modifying the switching state of the switching component to switch the data stream from being input into the second digital channel to being input into the first digital channel.

12. The method of claim 11, comprising:
    in response to determining that the data stream is to be switched from being input into the first digital channel the second time to being input into the second digital channel a second time:
        storing a third state of the first decimator; and
        modifying the switching state of the switching component to switch the data stream from being input into the first digital channel to being input into the second digital channel.

13. The method of claim 9, wherein the initializing the second decimator comprises:
    restoring a saved state of the second decimator to the second decimator.

14. The method of claim 9, comprising:
    in response to determining that the data stream is to be switched from being input into the first digital channel to being input into the second digital channel, implementing one or more blanking intervals before modifying the switching state of the switching component to switch the data stream from being input into the first digital channel to being input into the second digital channel.

15. The method of claim 9, comprising:
    switching the first digital channel from processing the data stream of the analog channel to processing a different data stream of a different analog channel.

16. A method comprising:
    applying a first set of parameters to a component of a digital channel to initialize the component to perform a first type of processing upon a data stream input into the digital channel by a modulator of an analog channel; and
    in response to determining that the component is to perform a second type of processing upon the data stream, applying a second set of parameters, comprising at least one parameter different than parameters of the first set of parameters, to the component to initialize the component to perform the second type of processing upon the data stream, wherein the component comprises a decimator, wherein the first set of parameters comprises a first set of decimator control parameters, and wherein the second set of parameters comprises a second set of decimator control parameters comprising at least one decimator control parameter different than decimator control parameters of the first set of decimator control parameters.

17. The method of claim 16, wherein the digital channel comprise a filter component configured to utilize filter control parameters.

18. The method of claim 16, wherein the first set of parameters are tuned to process a first type of data by the component and the second set of parameters are tuned to process a second type of data by the component.

19. The method of claim 16, comprising:
    in response to determining that the component is to perform the second type of processing upon the data stream, storing a first state of the component as a first stored state and clearing the first state of the component.

20. The method of claim 19, comprising:
    in response to determining that the component is to perform the first type of processing upon the data stream after determining that the component is to perform the second type of processing upon the data stream, restoring the first stored state to the component to initialize the component to perform the first type of processing upon the data stream.

* * * * *